US010756194B2

(12) United States Patent
Bao et al.

(10) Patent No.: US 10,756,194 B2
(45) Date of Patent: *Aug. 25, 2020

(54) SHARED METAL GATE STACK WITH TUNABLE WORK FUNCTION

(71) Applicant: INTERNATIONAL BUSINESS MACHINES CORPORATION, Armonk, NY (US)

(72) Inventors: Ruqiang Bao, Niskayuna, NY (US); Siddarth A. Krishnan, Newark, CA (US); Unoh Kwon, Fishkill, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/139,795

(22) Filed: Sep. 24, 2018

(65) Prior Publication Data

US 2019/0027572 A1    Jan. 24, 2019

Related U.S. Application Data

(60) Continuation of application No. 15/908,085, filed on Feb. 28, 2018, now Pat. No. 10,243,055, which is a division of application No. 15/176,902, filed on Jun. 8, 2016, now Pat. No. 10,002,937.

(51) Int. Cl.
*H01L 29/49* (2006.01)
*H01L 29/78* (2006.01)
(Continued)

(52) U.S. Cl.
CPC .... *H01L 29/4966* (2013.01); *H01L 21/30608* (2013.01); *H01L 21/823821* (2013.01);
(Continued)

(58) Field of Classification Search
None
See application file for complete search history.

(56) References Cited

U.S. PATENT DOCUMENTS 8,399,344 B2    3/2013    Pierreux et al.
9,018,054 B2    4/2015    Yoshida et al.
(Continued)

FOREIGN PATENT DOCUMENTS

TW    201133644    10/2011

OTHER PUBLICATIONS

Jungmin Moon et al., The Work Function Behavior of Aluminum-Doped Titanium Carbide Grown by Atomic Layer Deposition, in IEEE Transactions on Electron Devices, vol. 63, No. 4, pp. 1423-1427, Apr. 2016.
List of IBM Patents or Patent Applications Treated as Related dated Sep. 24, 2018, 2 pages.

*Primary Examiner* — Marcos D. Pizarro
*Assistant Examiner* — Quinton A Brasfield
(74) *Attorney, Agent, or Firm* — Tutunjian & Bitetto, P.C.; Kevin Michael Jordan

(57) ABSTRACT

Semiconductor devices include at least one semiconductor fin in each of a first region and a second region. A first work function stack includes a bottom layer and a middle layer formed over the at least one semiconductor fin in the first region. A second work function stack includes a first layer and a second layer formed over the at least one semiconductor fin in the second region. The first layer is continuous with the bottom layer of the first work function stack and the second layer is continuous with the middle layer of the first work function stack, but has a smaller thickness than the middle layer.

16 Claims, 7 Drawing Sheets

(51) Int. Cl.
*H01L 29/66* (2006.01)
*H01L 21/306* (2006.01)
*H01L 21/8238* (2006.01)
*H01L 21/84* (2006.01)
*H01L 27/092* (2006.01)
*H01L 27/12* (2006.01)

(52) U.S. Cl.
CPC .... *H01L 21/823842* (2013.01); *H01L 21/845* (2013.01); *H01L 27/0924* (2013.01); *H01L 27/1211* (2013.01); *H01L 29/66795* (2013.01); *H01L 29/785* (2013.01)

(56) References Cited

U.S. PATENT DOCUMENTS

| | | |
|---|---|---|
| 9,059,042 B2 | 6/2015 | Xie et al. |
| 9,093,302 B2 | 7/2015 | Xie et al. |
| 2013/0161764 A1* | 6/2013 | Wong .............. H01L 21/823842 257/410 |
| 2014/0239407 A1 | 8/2014 | Manabe et al. |
| 2015/0132953 A1 | 5/2015 | Nowling et al. |
| 2015/0179640 A1 | 6/2015 | Kim et al. |
| 2015/0221743 A1* | 8/2015 | Ho ...................... H01L 29/4966 257/392 |
| 2015/0371872 A1* | 12/2015 | Foster ............... H01L 21/28088 438/754 |
| 2016/0351568 A1* | 12/2016 | Chang ................ H01L 29/0847 |

* cited by examiner

US 10,756,194 B2

1

SHARED METAL GATE STACK WITH TUNABLE WORK FUNCTION

BACKGROUND

Technical Field

The present invention generally relates to semiconductor devices and, more particularly, to semiconductor devices having tuned work functions.

Description of the Related Art

The work function of a fin field effect transistor (FinFET) is one parameter that may be tuned according to design specifications and influence the threshold voltage of the device. In p-type field effect transistors (pFETs), the work function is usually set by the deposition of metal nitrides, such as titanium nitride and tantalum nitride. However, the intrinsic characterization of atomic layer deposition offers little tunability of the pFET work function.

While n-type field effect transistor (nFET) first patterning provides for the fabrication of devices with lower gate resistance than pFET-first patterning, conventional nFET-first patterning further limits the tunability of pFET work function, since most pFET work function tuning processes are incompatible with conventional nFET-first patterning. In addition, conventional nFET-first patterning necessitates longer-duration etches to make the nFET stack accommodate a pFET.

SUMMARY

A semiconductor device includes at least one semiconductor fin in each of a first region and a second region. A first work function stack includes a bottom layer and a middle layer formed over the at least one semiconductor fin in the first region. A second work function stack includes a first layer and a second layer formed over the at least one semiconductor fin in the second region. The first layer is continuous with the bottom layer of the first work function stack and the second layer is continuous with the middle layer of the first work function stack, but has a smaller thickness than the middle layer.

An integrated chip includes a first semiconductor device and a second semiconductor device. The first semiconductor device includes a first semiconductor fin and a first work function stack. The first work functions tack includes a bottom layer and a middle layer, formed over the first semiconductor fin. The second semiconductor device includes a second semiconductor fin and a second work function stack. The second work function stack includes a first layer and a second layer, formed over the second semiconductor fin. The first layer is continuous with the bottom layer of the first work function stack and the second layer is continuous with the middle layer of the first work function stack, but has a smaller thickness than the middle layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

2

Figure 1:
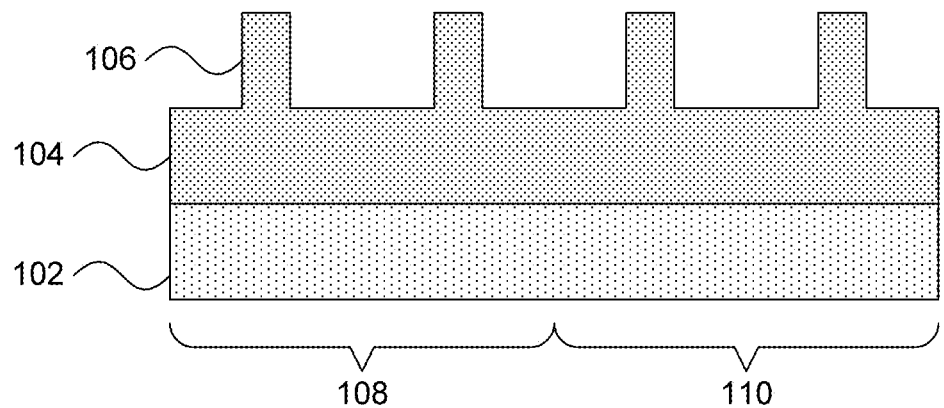
Figure 2:
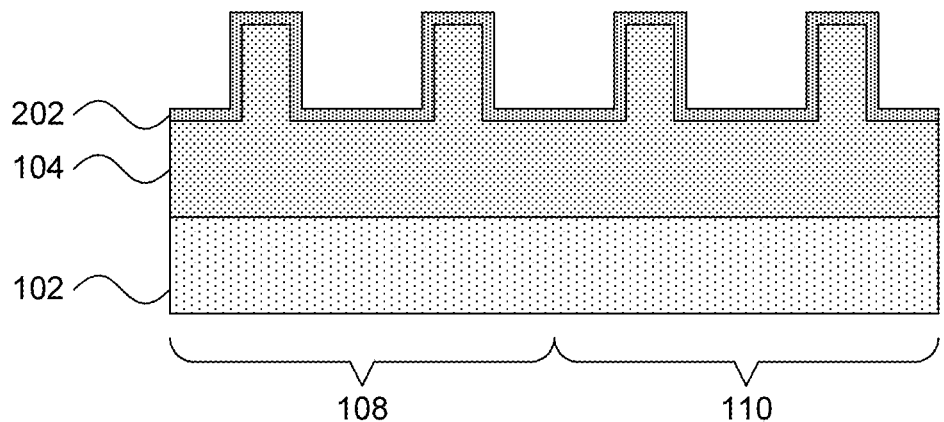
Figure 3:
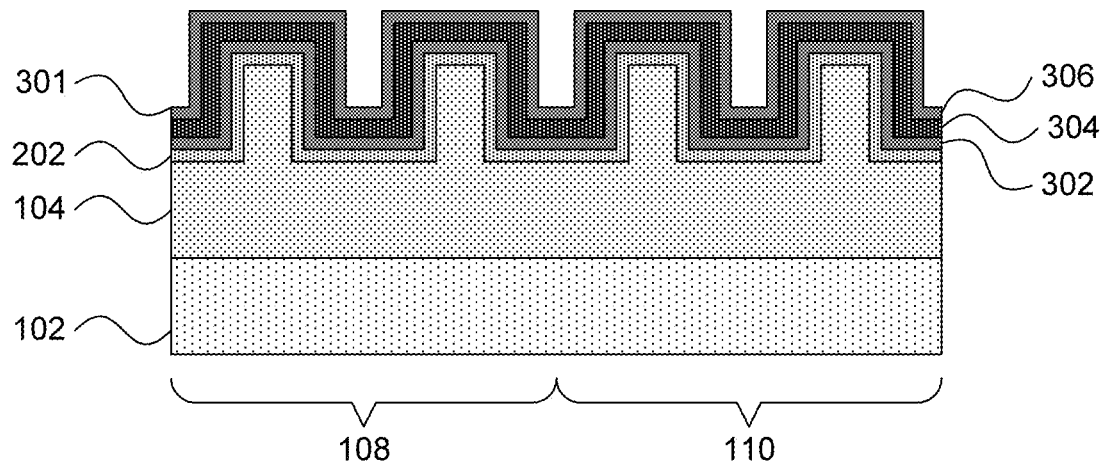
Figure 4:
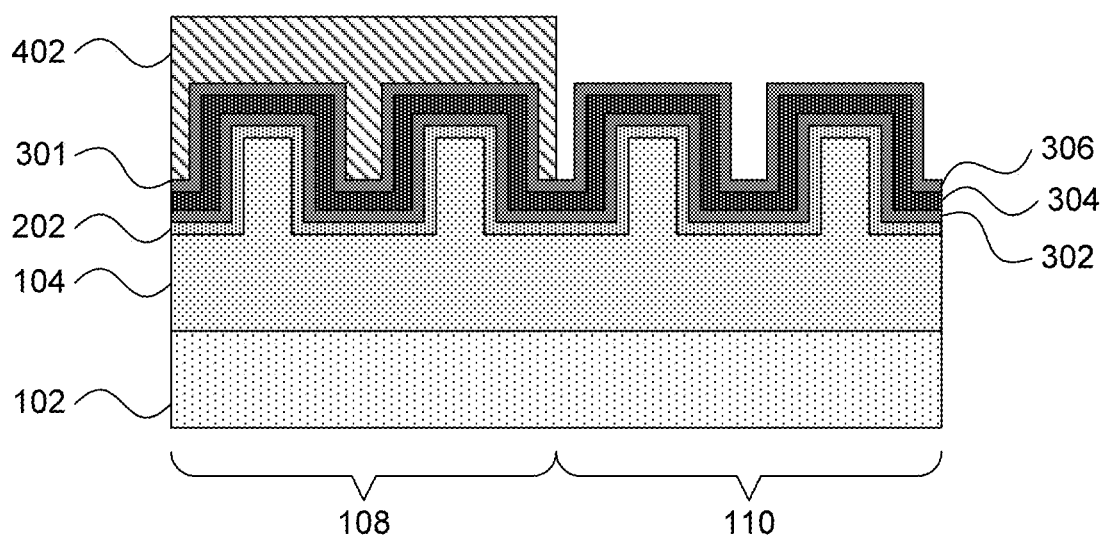
Figure 5:
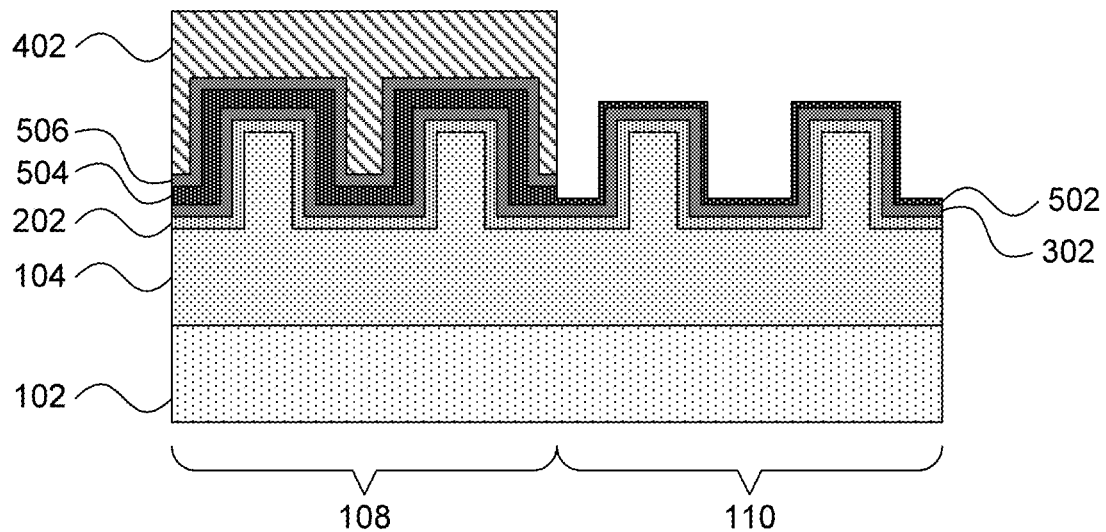
Figure 6:
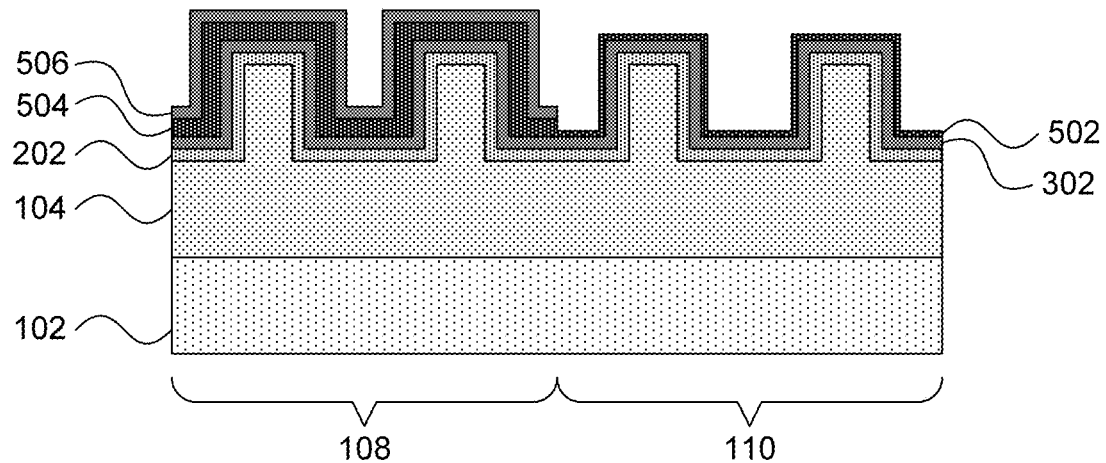
Figure 7:
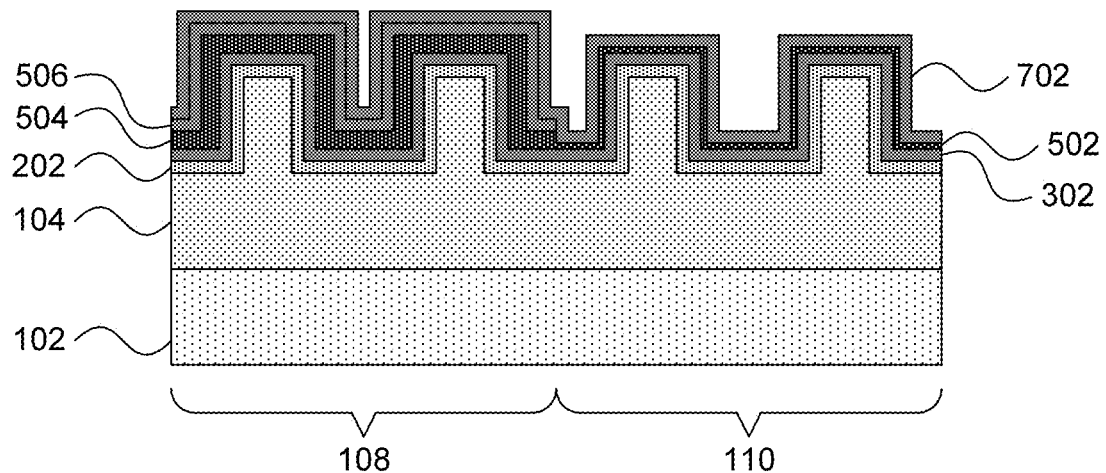
Figure 8:
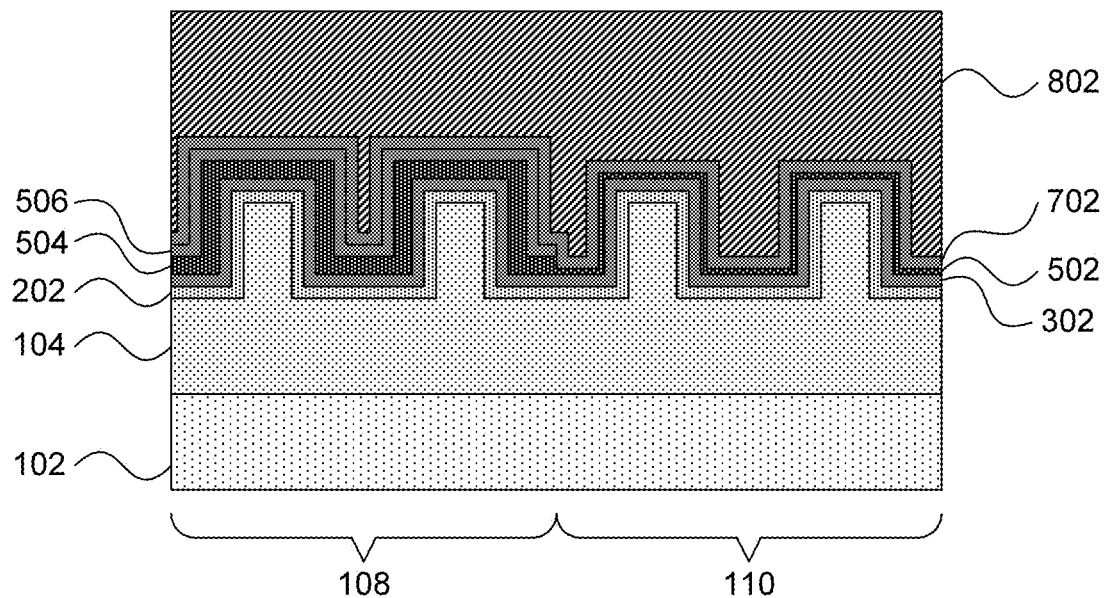
Figure 9:
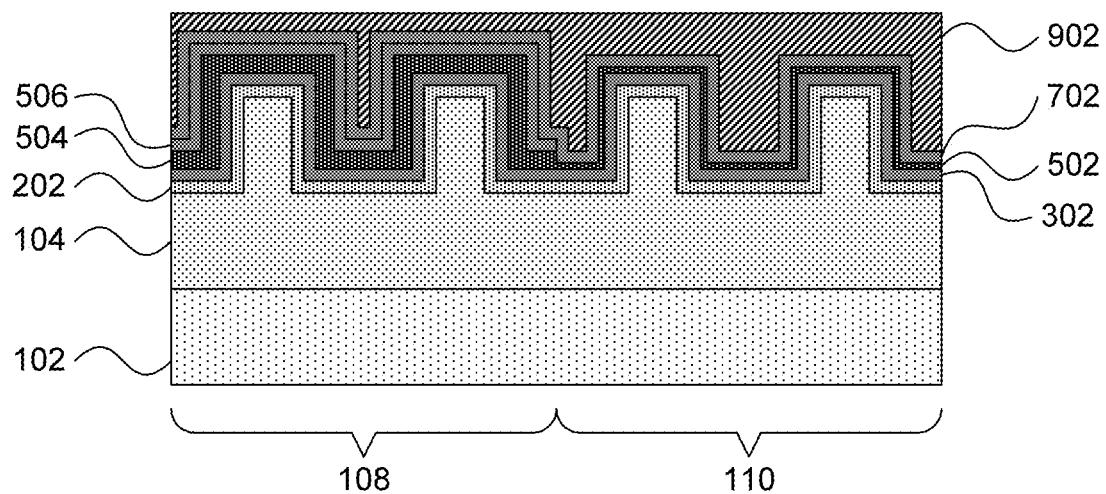
Figure 10:
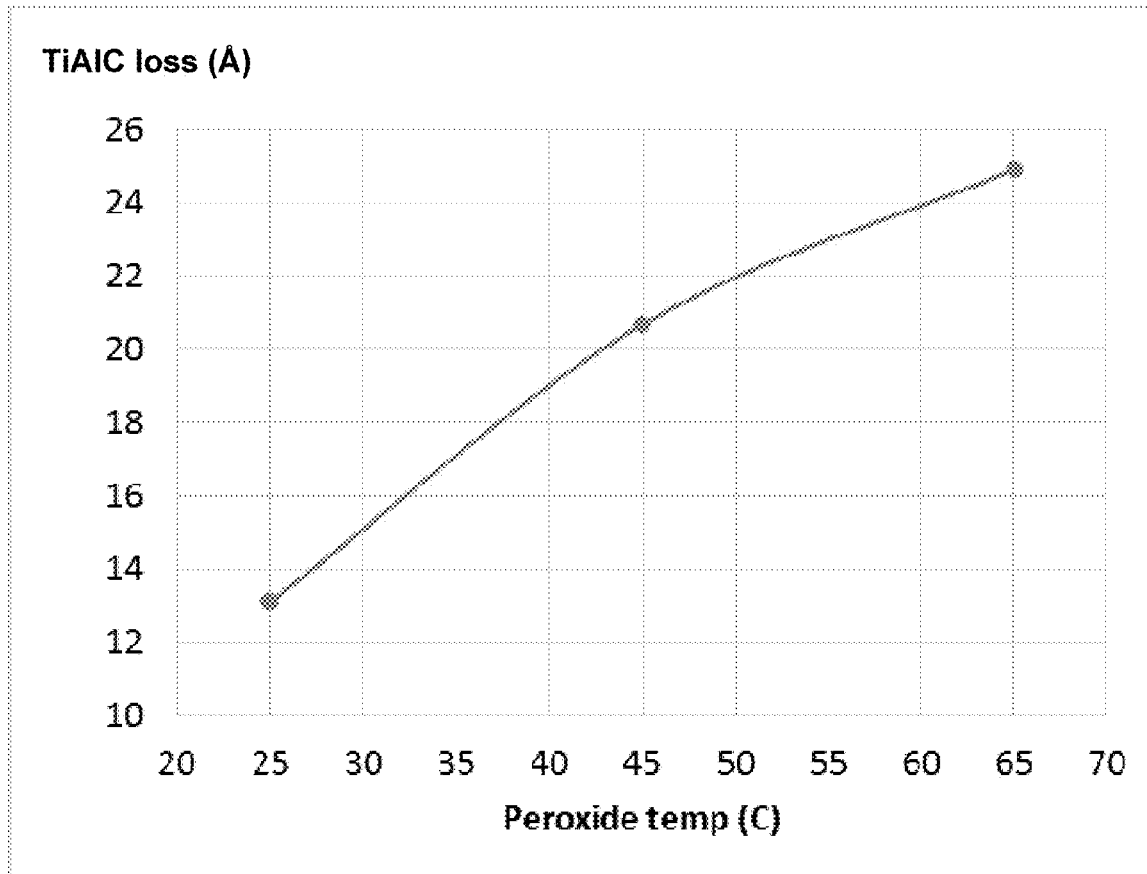
Figure 11:
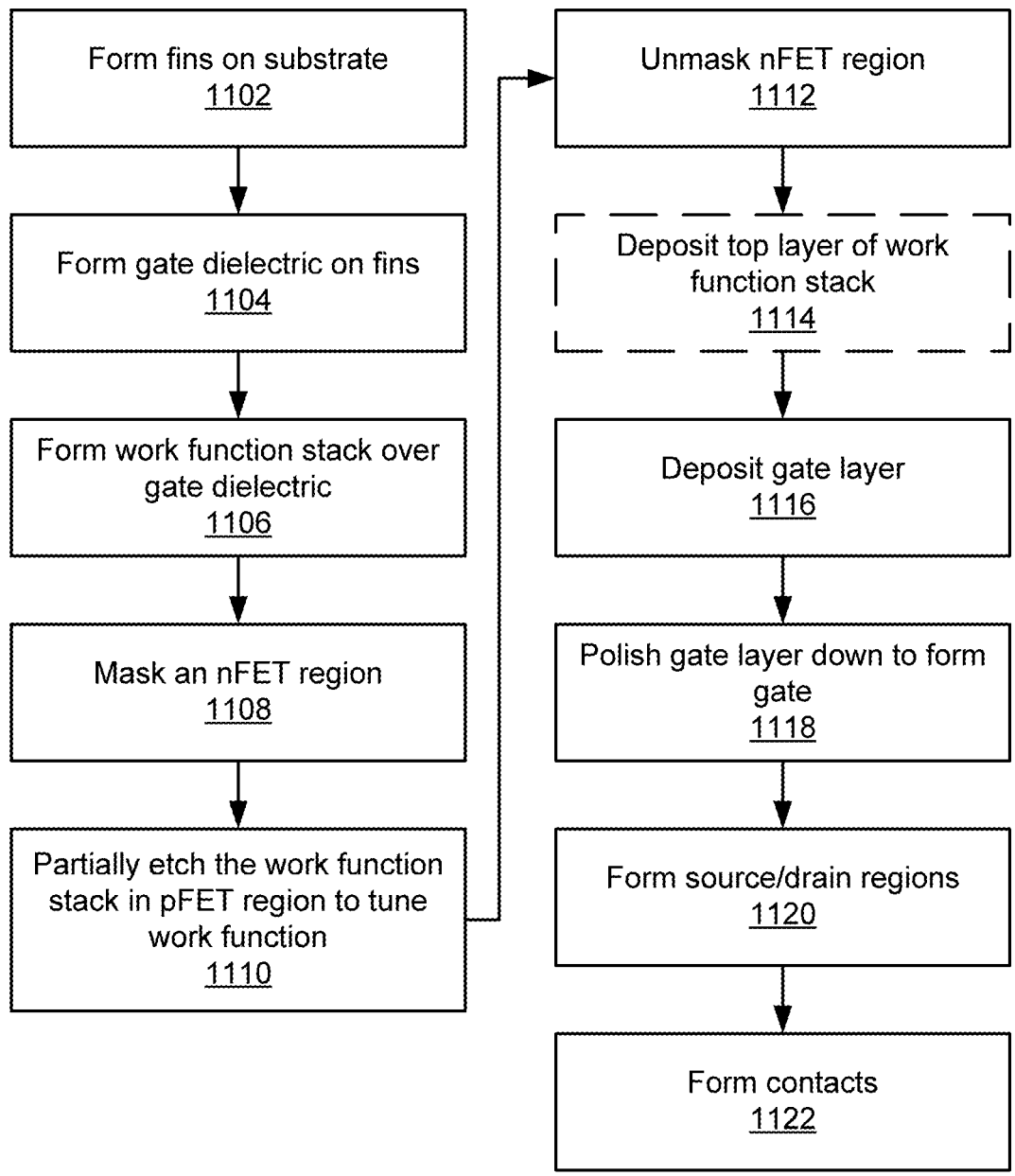
Figure 12:
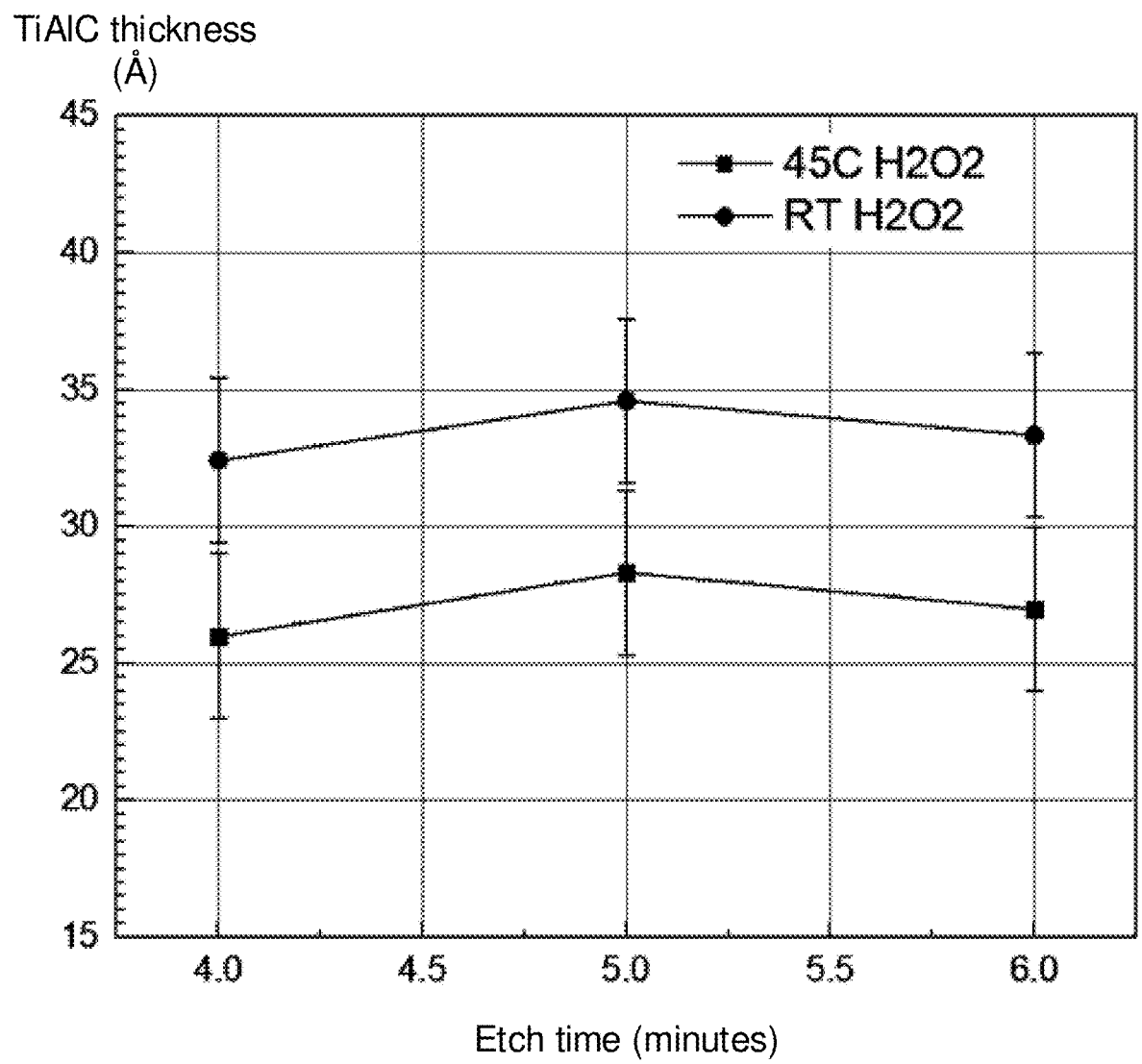

FIG. 1 is a diagram of a step in the fabrication of n-type field effect transistor (nFET) and p-type field effect transistor (pFET) devices in accordance with the present principles;

FIG. 2 is a diagram of a step in the fabrication of nFET and pFET devices in accordance with the present principles;

FIG. 3 is a diagram of a step in the fabrication of nFET and pFET devices in accordance with the present principles;

FIG. 4 is a diagram of a step in the fabrication of nFET and pFET devices in accordance with the present principles;

FIG. 5 is a diagram of a step in the fabrication of nFET and pFET devices in accordance with the present principles;

FIG. 6 is a diagram of a step in the fabrication of nFET and pFET devices in accordance with the present principles;

FIG. 7 is a diagram of a step in the fabrication of nFET and pFET devices in accordance with the present principles;

FIG. 8 is a diagram of a step in the fabrication of nFET and pFET devices in accordance with the present principles;

FIG. 9 is a diagram of a step in the fabrication of nFET and pFET devices in accordance with the present principles;

FIG. 10 is a graph of etch behavior relative to etch temperature in accordance with the present principles;

FIG. 11 is a block/flow diagram of a method of fabricating nFET and pFET devices in accordance with the present principles; and FIG. 12 is a graph of etch behavior relative to time in accordance with the present principles.

DETAILED DESCRIPTION

Embodiments of the present invention provide an n-type field effect transistor (nFET) first patterning process with high tunability for the work function of p-type field effect transistors (pFETs). Using a peroxide etch, the gate stack can be carefully modulated by the peroxide temperature, which provides for tuning for the thickness of a work function layer in the nFET-first fabrication process, thereby tuning the threshold voltage of the device.

Referring now to FIG. 1, a step in the fabrication of nFET and pFET devices is shown. A semiconductor-on-insulator substrate is formed from a buried insulator layer 102 and a semiconductor layer 104. In one embodiment, fins 106 are formed from the semiconductor layer 104 and are divided into two regions: an nFET region 108 and a pFET region 110. In an alternative embodiment, fins 106 may be formed on the semiconductor layer from a different material. In one example of an alternative embodiment, the fins 106 may be formed from a III-V semiconductor, while the semiconductor layer 104 may be formed from a group IV semiconductor. It is specifically contemplated that the buried insulator layer 102 may be formed from silicon dioxide, but it should be understood that any appropriate insulator material may be used.

In an alternative embodiment, the semiconductor layer 104 may be a bulk-semiconductor substrate, and the buried insulator layer 102 may be omitted. In one example, the semiconductor layer 104 may be a group IV (IUPAC group 14 on the periodic table of elements) semiconductor, for example a silicon-containing material. Illustrative examples of silicon-containing materials suitable for the semiconductor layer 104 include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride and zinc selenide.

The fins 106 may be formed by any appropriate process. In one exemplary embodiment, the fins 106 may be formed by a photolithographic process that masks fin regions and uses an anisotropic etch, such as reactive ion etching (RIE) to remove unmasked material. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching, or laser ablation. Alternatively, the fin structures 106 can be formed by spacer imaging transfer.

The term "III-V semiconductor" denotes a semiconductor material that includes at least one element from Group III (IUPAC group 13) of the Periodic Table of Elements and at least one element from Group V (IUPAC group 15) of the Periodic Table of Elements. Typically, III-V compound semiconductors are binary, ternary or quaternary alloys including III/V elements. Examples of III-V compound semiconductors that can be used in the present invention to form fins 106 include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus and combinations thereof.

It should be recognized that, although the present invention is described in the context of fin field effect transistors (FinFETs), it should be recognized that the present principles apply with equal force to planar structures. Furthermore, nanowire and nanosheets structures can be used as an alternative to fin and planar devices.

Referring now to FIG. 2, a step in the fabrication of nFET and pFET devices is shown. A gate dielectric layer 202 is conformally deposited over the fins 106. It is specifically contemplated that a high-k dielectric material may be used, which has a dielectric constant k that is higher than that of silicon dioxide.

Such higher dielectric constant dielectric materials may include, but are not limited to, hafnium oxides, zirconium oxides, aluminum oxides, titanium oxides, lanthanum oxides, strontium titanium oxides, lanthanum aluminum oxides, yttrium oxides, and mixtures thereof. Other examples of high-k gate dielectric materials include hafnium silicate, hafnium silicon oxynitride, and combinations thereof.

It is specifically contemplated that the gate dielectric layer 202 may be formed using a chemical vapor deposition (CVD) process, but it should be understood that any appropriate deposition process may be used instead. Other forms of deposition include physical vapor deposition (PVD), atomic layer deposition (ALD), and gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Referring now to FIG. 3, a step in the fabrication of nFET and pFET devices is shown. A work function metal stack 301 is deposited over the gate dielectric layer 202 and includes three layers. A first layer 302 and a third layer 306 are formed from a same material, while the second layer is formed from a different material. In one specific embodiment, the first and third layers 302 and 306 are formed from titanium nitride, while the second layer 304 is formed from titanium aluminum carbide. To meet uniformity needs, the work function metal stack 301 is deposited using ALD, though it should be understood that other deposition processes may be used instead.

Although titanium nitride and titanium aluminum carbide are specifically contemplated for the work function metal stack 301, it should be understood that any appropriate materials may be used that provide the desired work function properties for the nFET region 108 as well as the pFET region 110—it is particularly contemplated that the two materials have etch selectivity with respect to one another that makes it possible to precisely tune the thicknesses of the layers to achieve specific properties in the finished devices. Hydrogen peroxide has very high selectivity between titanium nitride and titanium aluminum carbide. The first layer 302 may have an exemplary thickness between about 0 Å and about 25 Å, the second layer 304 may have an exemplary thickness between about 30 Å and about 100 Å, and the third layer 306 may have an exemplary thickness of between about 5 Å to about 50 Å. To reduce the resistance in the gate, these layers may be deposited without an air break.

Referring now to FIG. 4, a step in the fabrication of nFET and pFET devices is shown. The nFET region 108 is masked using an appropriate masking process. In one example, a pattern is produced by applying a photoresist to the surface; exposing the photoresist to a pattern of radiation; and then developing the pattern into the photoresist utilizing a resist developer. In one embodiment, the unexposed area is removed, while in an alternative embodiment the exposed area is removed. What remains is mask 402, which covers the fins 106 in the nFET region 108.

Referring now to FIG. 5, a step in the fabrication of nFET and pFET devices is shown. A wet etch is used to remove material from the pFET region 110. It is particularly contemplated that a hydrogen peroxide etch may be used to remove the third layer 306 and to partially remove the second layer 304 in the pFET region 110. In one embodiment, the wet etch may include an aqueous solution of hydrogen peroxide having a concentration between about 1:1 and about 40:1. The nFET region 108 is not affected because of mask 402, having the full stack of first layer 302, the untrimmed portion 504 of second layer 304, and the remaining portion 506 of the third layer 306. In the pFET region, the trimmed second layer 502 has a thickness that is controlled to provide a specific work function for the finished pFET device. The thickness of the trimmed second layer 502 can be controlled because the solvent is selected to provide saturation at a given temperature. Thus, once the correct amount of material has been removed from the second layer 304, the chemical reaction stops on its own, leaving a very precise thickness of the material.

Referring now to FIG. 6, a step in the fabrication of nFET and pFET devices is shown. The mask 402 is removed by any appropriate etching process to expose the underlying work function stack. It is specifically contemplated that an isotropic etch such as a wet or dry etch may be used to remove the mask 402, with the etch being selective to the material of the mask 402, such that it does not affect the work function stack. As used herein, the term "selective" in reference to a material removal process denotes that the rate of material removal for a first material is greater than the rate of removal for at least another material of the structure to which the material removal process is being applied.

It should be noted that an interfacial oxide layer may have formed on the surface of the remaining third layer 506. In one particular embodiment, this interfacial oxide layer may be formed from titanium oxynitride.

Referring now to FIG. 7, a step in the fabrication of nFET and pFET devices is shown. A top layer 702 is conformally formed on the work function stack in both the nFET region 108 and the pFET region 110. The top layer 702 may be formed from, for example, titanium nitride, tantalum nitride, or any other appropriate material which can reduce the effect of downstream electrode material on the work function of the device. The top layer 702 is optional if there is no concern about downstream electrode material fill or deposition or if there is for some other reason less impact on work function from the downstream electrode material.

Referring now to FIG. 8, a step in the fabrication of nFET and pFET devices is shown. A layer 802 of gate material is deposited over all of the fins 106, in both the nFET region 108 and the pFET region 110. In one embodiment, the gate material 802 is tungsten, but it should be understood that any appropriate gate metal may be used. Exemplary alternative gate metals include, e.g., tungsten, nickel, titanium, molybdenum, tantalum, copper, platinum, silver, gold, ruthenium, iridium, cobalt, aluminum, rhenium, rhodium, and alloys that include at least one of the aforementioned conductive elemental metals.

In an alternative embodiment using a replacement metal gate process, the layer 802 may be formed from a dummy gate material such as, e.g., polysilicon. After subsequent finishing steps to, e.g., form source/drain regions on the fins 106, the dummy gate material is removed and a metal gate as described above is created.

Referring now to FIG. 9, a step in the fabrication of nFET and pFET devices is shown. The gate material layer 802 is polished down to an appropriate height using, e.g., chemical mechanical planarization, to create the gate 902. CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer. Alternatively, the CMP process may be timed to leave an amount of gate material above the level of the top layer 702.

After formation of the gate, additional processing may be needed to create other structures of the FinFETs in the nFET and pFET regions 108 and 110, including the formation of source/drain regions and the formation of electrical contacts to the gate 902.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to FIG. 10, a diagram of etch behavior of hydrogen peroxide with respect to temperature is shown. The vertical axis shows the amount of titanium aluminum carbide loss to the second work function stack layer 304 after five minutes of hydrogen peroxide etching, measured in angstroms. The horizontal axis shows the temperature of the peroxide wash in degrees Celsius. This etch will stop itself after a period of time defined by the temperature of the peroxide wash.

Referring now to FIG. 12, a diagram of etch behavior at different temperatures is shown. The vertical axis shows the remaining thickness of the titanium aluminum carbide layer, measured in Angstroms with appropriate error bars, and the horizontal axis shows the amount of time elapsed. As can be clearly seen, the etch essentially halts after about four minutes, with measured differences falling well within the measurement resolution of the error bars. The warmer temperature etch, performed at 45° C. and indicated on the graph by circular points, leaves less material remaining than the etch performed at room temperature, indicated on the graph by square points.

Referring now to FIG. 11, a method of forming semiconductor devices including pFET and nFET regions with a shared gate is shown. Block 1102 forms fins 106 on a substrate, for example forming the fins 106 on or from the semiconductor layer 104. Formation of the fins 106 may be accomplished using, e.g., photolithography to mask fin regions followed by an anisotropic etch or spacer image transfer. Block 1104 then conformally deposits a dielectric layer 202 on the fins 106.

Block 1106 forms the work function stack 301 over the gate dielectric 202 in both the nFET region 108 and the pFET region 110. It is specifically contemplated that the work function stack 301 may include a first layer 302 of titanium nitride, a second layer 304 of titanium aluminum carbide, and a third layer 306 of titanium nitride, but any appropriate stack materials may be used to provide a controllable work function through a selective etch.

Block 1108 masks the nFET region 108 using, e.g., photolithographic processes to create mask 402 over the nFET region 108. Block 1110 uses a selective etch that is limited to the pFET region 110 to remove the third layer 306 from that region and to partially trim the second layer 304, decreasing the thickness of the second layer 304 to a thickness determined to provide advantageous work function properties in the final pFET device. It is specifically contemplated that block 1110 may employ a hydrogen peroxide etch that etches away a specific amount of the second layer 304. Because this etch is chemically limited to remove only the specific amount, the etch need not be a timed etch and consistency is improved. Block 1112 removes the mask 402 from the nFET region 108 after the etch of block 1110 is performed.

Block 1114 optionally deposits a top layer 702 over the remaining work function stack layers on the nFET region 108 and the pFET region 110. Block 1116 then deposits a metal gate layer 802 of, e.g., tungsten and block 1118 polishes the gate layer 802 down to form the gate 902 using, e.g., a CMP process. Block 1120 forms source/drain regions on areas of the fins 106 that are not covered by the gate 902 and block 1122 forms electrical contacts to the gate 902 and to the source/drain regions. The source and drain regions may be appropriately doped, for example by implantation or in situ during formation. In an alternative embodiment, the gate 902 is a dummy gate structure that is replaced in a subsequent step with a metal gate.

Referring now to FIG. 12, a diagram of etch behavior of hydrogen peroxide over time is shown. The vertical axis shows the amount of titanium aluminum carbide remaining on the second work function stack layer 304, while the horizontal axis shows time. As can be seen, the hydrogen peroxide etch does not remove a significant amount of material after four minutes, with the amount remaining after a room temperature etch and the amount remaining after an etch at 45° C. being shown separately.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
at least one semiconductor fin in each of a first region and a second region;
a first work function stack, comprising a bottom layer and a middle layer formed over the at least one semiconductor fin in the first region; and
a second work function stack, comprising a first layer and a second layer, formed over the at least one semiconductor fin in the second region, the first layer being continuous with the bottom layer of the first work function stack and the second layer being continuous with the middle layer of the first work function stack but having a smaller thickness than the middle layer.

2. The semiconductor device of claim 1, further comprising a continuous gate dielectric layer between the first work function stack and the one or more semiconductor fins of the first region and between the second work function stack and the one or more semiconductor fins of the second region.

3. The semiconductor device of claim 1, further comprising a continuous gate formed over the first and the second work function stack.

4. The semiconductor device of claim 1, wherein the bottom layer and the first layer are formed from titanium nitride and the middle layer and the second.

5. The semiconductor device of claim 1, further comprising a continuous additional work function stack layer formed over the first work function stack and the second work function stack.

6. The semiconductor device of claim 1, further comprising first source and drain regions on the one or more semiconductor fin of the first region and second source and drain regions on the one or more semiconductor fin of the second region.

7. The semiconductor device of claim 1, wherein the first region forms an n-type field effect transistor and the second region forms a p-type field effect transistor.

8. An integrated chip, comprising:
a first semiconductor device, comprising:
a first semiconductor fin;
a first work function stack, comprising a bottom layer and a middle layer, formed over the first semiconductor fin; and
a second semiconductor device, comprising:
a second semiconductor fin;
a second work function stack, comprising a first layer and a second layer, formed over the second semiconductor fin, the first layer being continuous with the bottom layer of the first work function stack and the second layer being continuous with the middle layer of the first work function stack but having a smaller thickness than the middle layer.

9. The integrated chip of claim 8, further comprising a continuous gate dielectric layer between the first work function stack and the first semiconductor fin and between the second work function stack and the second semiconductor fin.

10. The semiconductor device of claim 8, wherein the bottom layer and the first layer are formed from titanium nitride and the middle layer and the second layer are formed from titanium aluminum carbide.

11. The semiconductor device of claim 8, further comprising a continuous additional work function stack layer formed over the first work function stack and the second work function stack.

12. The semiconductor device of claim 8, wherein the first semiconductor device further comprises first source and drain regions on the first semiconductor fin and wherein the second semiconductor device comprises second source and drain regions on the second semiconductor.

13. The semiconductor device of claim 8, wherein the semiconductor device is an n-type field effect transistor and wherein the second semiconductor device is a p-type field effect transistor.

14. The integrated chip of claim 8, wherein the first semiconductor device further comprises a first portion of a shared gate formed over the first work function stack and the second semiconductor device further comprises a second portion of the shared gate formed over the second work function stack.

15. The semiconductor device of claim 1, wherein the second layer and the middle layer are formed from the same material.

16. The integrated chip of claim 8, wherein the second layer and the middle layer are formed from the same material.

\* \* \* \* \*